United States Patent [19]

Stumpe et al.

[11] Patent Number: 5,918,792
[45] Date of Patent: Jul. 6, 1999

[54] APPARATUS AND METHOD FOR FILLING A BALL GRID ARRAY

[75] Inventors: Kenneth Eugene Stumpe; William Hernandez, Jr., both of Tucson, Ariz.

[73] Assignee: RVSI Vanguard, Inc., Tucson, Ariz.

[21] Appl. No.: 08/832,647

[22] Filed: Apr. 4, 1997

[51] Int. Cl.⁶ .............................. H01L 21/60; B23K 3/06
[52] U.S. Cl. .............................................. 228/41; 118/213
[58] Field of Search .................................. 228/244, 246, 228/180.22, 41, 56.3; 118/213; 29/879, 884

[56] References Cited

U.S. PATENT DOCUMENTS

| | | | |
|---|---|---|---|
| 5,431,332 | 7/1995 | Kirby et al. | 228/246 |
| 5,454,159 | 10/1995 | Norell | 228/179.1 |
| 5,620,927 | 4/1997 | Lee | 228/180.22 |
| 5,655,704 | 8/1997 | Sakessi et al. | 228/246 |
| 5,704,536 | 1/1998 | Chen et al. | 228/41 |

*Primary Examiner*—Samuel M. Heinrich
*Attorney, Agent, or Firm*—Herbert M. Shapiro

[57] ABSTRACT

The array of recesses in a ball grid array carrier or (device) are populated with solder balls through a closely spaced tooling plate or stencil which has a like array of apertures. A solder bin is moved along side rails over the stencil allowing solder balls to fill the apertures in the stencil settling on the corresponding recesses and held there by adhesive. Excess solder balls are moved along by the movement of the bin. The bin is held in close contact with the stencil to avoid misplacement of the balls by bowing the stencil and by forcing it into a plane coplanar with the bottom of the bin. Alternative techniques are magnetic or vacuum areas of the bottom of the bin to ensure complete contact with the stencil.

5 Claims, 3 Drawing Sheets

APPARATUS AND METHOD FOR FILLING A BALL GRID ARRAY

FIELD OF THE INVENTION

This invention relates to ball grid arrays and more particularly to the placement of solder balls onto the pattern of metallized pads or dots characteristic of such arrays.

BACKGROUND OF THE INVENTION

Ball grid arrays are well known in the art and are available commercially. Such an array comprises a plastic or a ceramic substrate with a pattern of pads or recesses, each providing a receptacle for a solder ball. The substrates, hereinafter referred to as carriers or devices, are available in strips containing a repetitive pattern of pads or recesses, and individual segments of the strip can be detached and used separately.

The task of populating the recesses reliably is a difficult one and a number of procedures to accomplish reliable solder ball placement have been devised. Pat No.5,431,332 issued Jul. 11, 1995 discloses one such procedure. The patent describes a station in a manufacturing line for the placement of solder balls on a ball grid array carrier. The carrier has a pattern of solder pads with an adhesion layer on the solder pads. A stencil, having a thickness of between one fourth and five fourths the diameter of a solder ball, is placed on the carrier. The stencil has a pattern of apertures which matches the pattern of pads on the carrier. The apparatus employs a pallet to move the carrier to the stencil and employs a solder ball dispenser for pouring solder balls in bulk over the stencil. The apparatus also includes a vibration device coupled to the station for urging the solder balls into the apertures in the stencil and onto the adhesive layer above the solder pads. Thereafter, a column of air moves across the surface of the stencil to remove the excess solder balls.

One problem with the aboved describe procedure is that a solder ball is less than 0.030 inch and the stencil is about one half that thickness. The stencil is seprated from the ball grid array a distance of about 0.015 inch to allow for flux. It is very difficult to maintain the stencil in a plane in registry with the ball grid array at such a small separation. Consequently, a solder ball may be misplaced between the stencil and the ball grid array, not in registry with solder pads. The dispensing of the solder balls in bulk and the use of an air knife to remove excess solder balls from the stencil also do not provide a sufficient arrangement for maintaining the tolerances required for the stencil. A mechanical arrangement for maintaining the stencil in a plane is much to be preferred. Such an arrangement would be similar to that of a silk screen process and would entail the movement of a solid reservoir container or solder ball bin over the stencil. But this again has it's own problems. Specifically, a problem exists as to how to maintain the ball bin attached to the stencil avoiding any gap therebetween and, again how to maintain the stencil in a plane.

BRIEF DESCRIPTION OF ILLUSTRATIVE EMBODIMENTS OF THIS INVENTION

In one embodiment of this invention, a ball grid array carrier or device is positioned in a longitudinal recess in a holder. The holder has elevated side rails for contact with a stencil (tooling plate or template). The stencil is bowed upwards along the central axis of the stencil over the ball grid array. A solid solder bin contacts the stencil forcing the stencil into a plane as the ball bin is lowered to engage the side rails. The bin, the stencil and the ball grid array (carrier) are thus forced into positions with the exacting tolerances required. The ball bin is partially filled with solder balls and the bin is moved along the side rails causing the balls to populate the pattern of holes in the stencil in registry with the matching pattern of recesses in the carrier. It is clear that the ball bin can be moved along the axis of the carrier or across the carrier and that the filling of the holes in the stencil would occur in either case.

In another embodiment, the ball bin is open to the front moving the balls much as an advancing U-shaped shovel would do. In another embodiment, the ball bin is made of a magnetic material to couple closely to the stencil. In still another embodiment, a vacuum may be used to ensure that the solder bin closely contacts the stencil.

DETAILED DESCRIPTION OF ILLUSTRATIVE EMBODIMENTS OF THIS INVENTION

Figure 1:
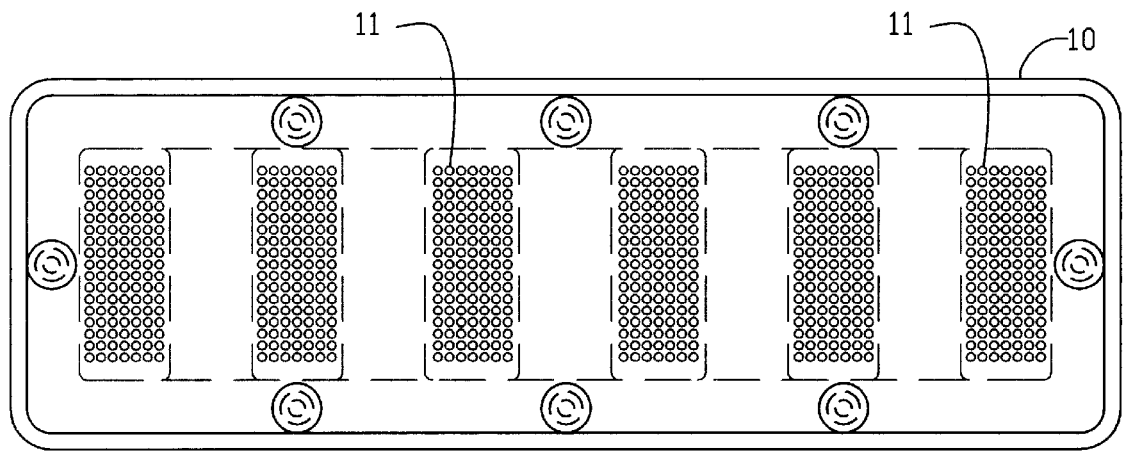
FIG. 1 is a schematic representation of a stencil or tooling plate for placement of solder balls on a ball grid array carrier or device.
Figure 2:
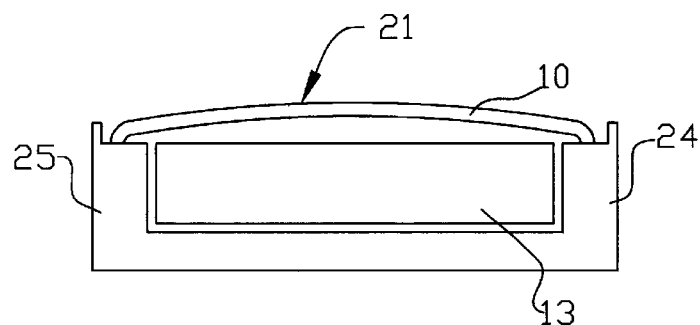
FIGS. 2 and 3 are schematic end views of apparatus for the placement of solder balls in accordance with the principles of this invention.

FIG. 1 shows a schematic top view of a stencil 10 having an array of holes 11 which correspond to the array of solder pads on a ball grid array (BGA) carrier or device. FIG. 2 is an end view of a holder for positioning a stencil over a BGA carrier. The holder is designated 12 and the carrier is designated 13 in FIG. 2.

Figure 3:
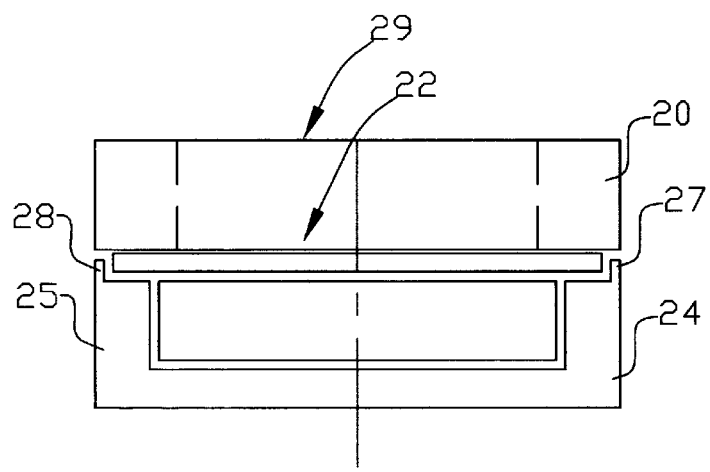

FIG. 3 shows an end view of the holder of FIG. 2 with a ball bin 20 positioned over the holder. It is noted that the stencil (or tooling plate) initially is bowed at 21 when positioned over the BGA carrier. The ball bin is solid and has a planar bottom surface 22 which contacts both side rails 23 and 24. When the ball bin is fully seated, it engages lips 27 and 28 to either side thereof to ensure proper registration of the holes in the stencil with the pads on the BGA carrier.

The ball bin has a central aperture 29 which provides a reservoir for the solder balls. The bin is partially filled with solder balls and the bin is moved along the side rails over the stencil. The solder balls fill the holes in the stencil coming to rest at the adhesive layer overlying the pads on the carrier and in registry with the pads. The carrier is then moved to a heating station where the positions of the balls are reflux soldered.

Figure 4:
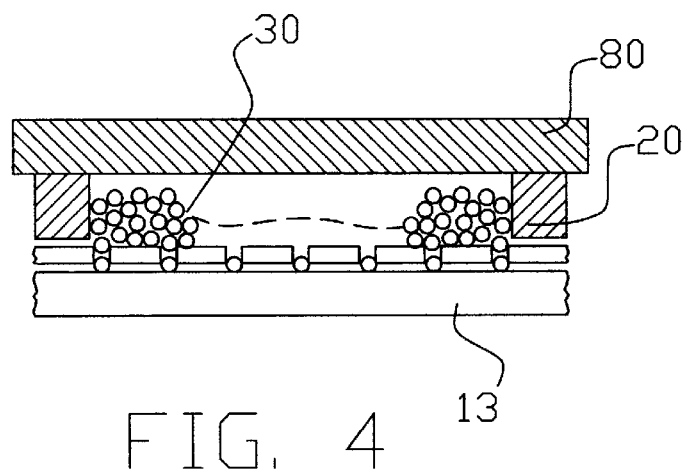
FIGS. 4 and 5 are schematic cross sections of the apparatus of FIGS. 2 and 3 showing different positions for the components of that apparatus.
Figure 5:
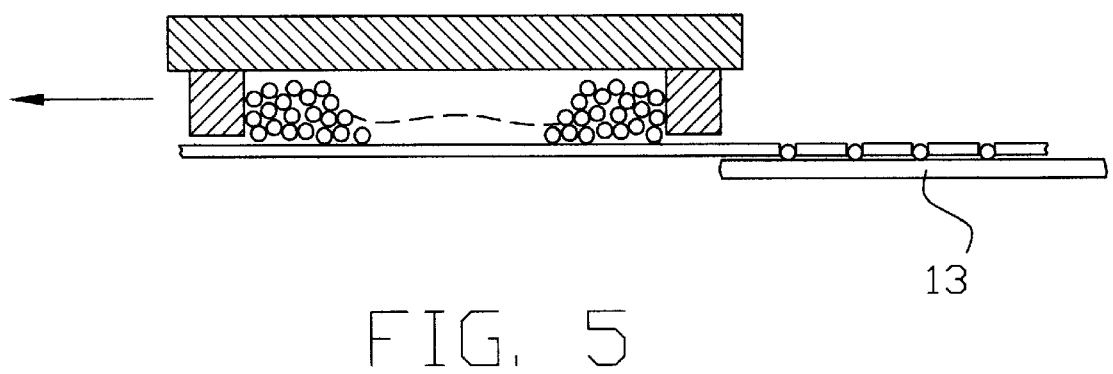

FIG. 4 shows a schematic cross section of the arrangement of FIG. 3 taken along a line perpendicular to the view of FIG. 3. Solder balls 30 are shown at the bottom of the bin with the holes in the stencil 10 filled with solder balls and contacting (the flux layer on) the BGA carrier 13. FIG. 5 is a cross section of the arrangement of FIG. 3 taken along the longitudinal axis of the holder. The figure shows the solder bin in a position beyond the holes in the stencil with the BGA carrier fully populated.

At this juncture in the ball placement process, the populated BGA carrier is removed from the stencil without dislodging the solder balls. This is accomplished by maintaining the stencil in place and by lowering the holder with the populated carrier in it, thus making way for positioning a new holder with a carrier properly with respect to the stencil.

Figure 6:
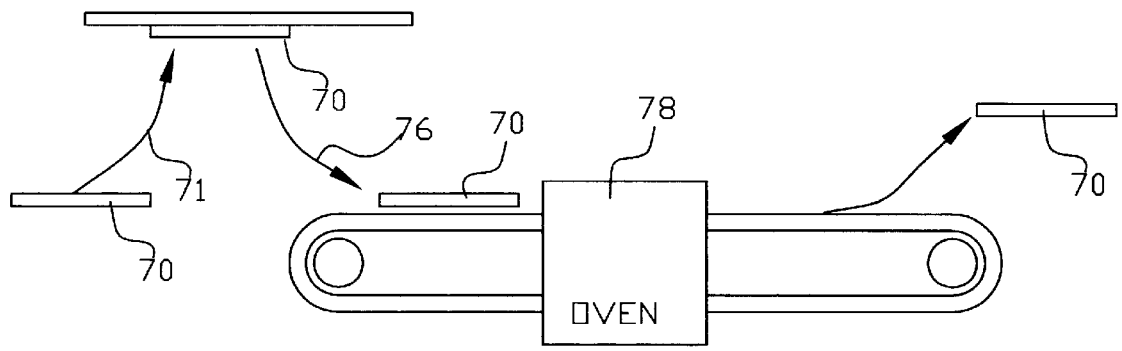
FIG. 6 is a schematic block diagram of potions of an automated line for implementing solder ball placement.

FIG. 6 shows schematically a holder 70 being moved upwards and to the right, as indicated by arrow 71, into position with respect to the stencil 72 and ball bin 73. After completion of the ball placement process, the holder with the populated carrier in place is moved downwards and again to the right as indicated by arrow 76. The holder, so moved, occupies a position on a clockwise rotating conveyor belt 77 which moves the holder into oven 78. The process is made continuous by supporting a stream of holders, on a belt, past a carrier positioning station to be advanced to a subsequent station where the holders are uplifted to the position shown in FIG. 6 for ball placement.

The misplacement of balls in the placement procedure is avoided by downward pressure on the ball bin to compress the stencil into a plane coplanar with the planar bottom of the ball bin. The pressure is supplied conveniently by weight 80 shown in FIG. 4.

Figure 7:
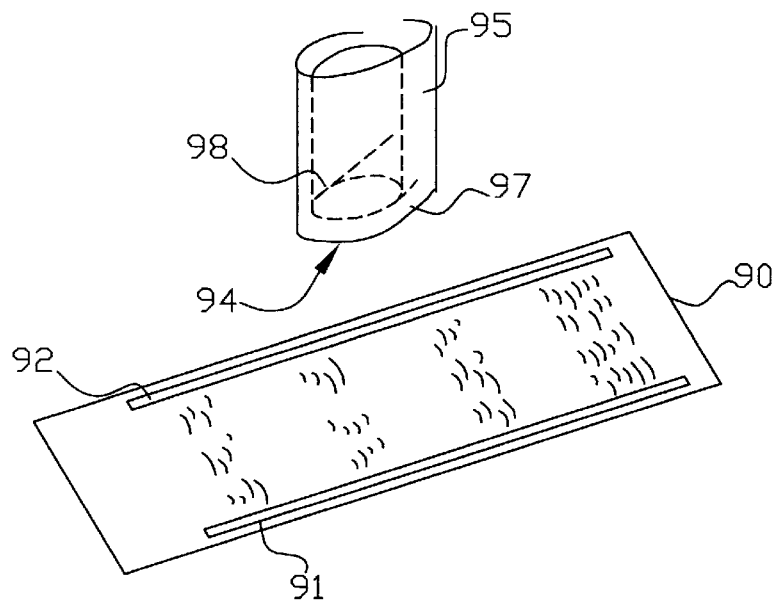
FIGS. 7 and 8 are schematic representations of alternative embodiments of this invention.

Also, close coupling between the solder bin and the stencil may be achieved by making the bin at least partially magnetic and by providing for corresponding glide portions of the stencil to include ferrous material, say, iron particles. FIG. 7 shows one such arrangement where a stencil 90 includes metallic side rails 91 and 92 and the planar bottom surface 94 of the ball bin 95 includes magnets 97 and 98.

Figure 8:
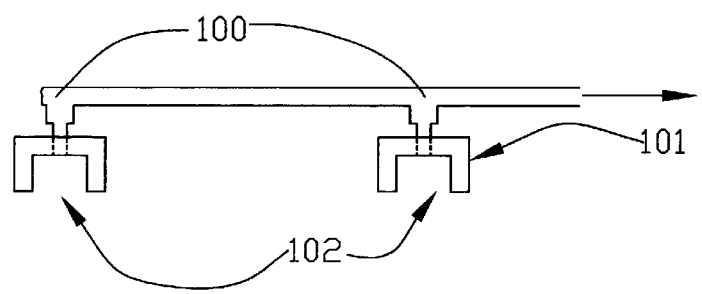

FIG. 8 shows an alternative arrangement where a vacuum is created in a channel 100 in ball bin 101, evacuating recesses 102 in the bottom planar surface of the ball bin. The recesses are configures to correspond to the positions of the glide rails as in FIG. 7 and the creation of a (slight) vacuum ensures continuous contact between the ball bin and the stencil yet permits movement of the ball bin over the stencil.

What is claimed is:

1. Apparatus for the placement of solder balls on a ball grid array carrier, said apparatus comprising an elongated holder defining an elongated recess therein for said carrier, said holder having an elevated guide rail to either side of said recess, a stencil overlying said recess and supported by said guide rails, said stencil having therein an array of apertures corresponding to the pattern of solder pads characteristic of said carrier, said apparatus also including a block of rigid material having a planar bottom surface contacting said stencil and for movement along said stencil, said block having therein a bin for solder balls, and means for moving said block along said stencil for moving said bin over said apertures in said stencil for filling said apertures.

2. Apparatus as in claim 1 wherein said stencil is bowed upwards along a central axis and said planar bottom surface of said ball bin presses downward on said stencil urging said stencil into a plane parallel with said surface when said surface contacts said guide rails.

3. Apparatus as in claim 2 wherein said holder has first and second spaced apart, longitudinal upstanding lips to engage the sides of said block of rigid material when said stencil is in a planar configuration.

4. Apparatus as in claim 1 wherein said solder bin has magnetic components in said planar bottom surface and said stencil has ferrous material in guide rails for contacting said magnetic components.

5. Apparatus as in claim 4 wherein said solder bin has recesses in said planar bottom surface and means for creating a vacuum in said recesses, said stencil having guide rails for communicating with said recesses.

* * * * *